United States Patent [19]

Wang

[11] Patent Number: 4,579,791

[45] Date of Patent: Apr. 1, 1986

[54] CELL ANODE

[75] Inventor: Chih-Chung Wang, Lexington, Mass.

[73] Assignee: Duracell Inc., Bethel, Conn.

[21] Appl. No.: 656,802

[22] Filed: Oct. 1, 1984

Related U.S. Application Data

[62] Division of Ser. No. 482,651, Apr. 6, 1983, Pat. No. 4,487,651.

[51] Int. Cl.$^4$ .................. H01M 4/42; H01M 4/04
[52] U.S. Cl. ...................... 429/50; 429/209; 429/224; 429/229; 429/230
[58] Field of Search .............. 429/229, 50, 209, 224, 429/230

[56] References Cited

U.S. PATENT DOCUMENTS 3,844,838  12/1974  Louzos ............................... 429/229
3,853,625  12/1974  Louzos ............................... 429/229

*Primary Examiner*—Donald L. Walton

*Attorney, Agent, or Firm*—Ronald S. Cornell; Israel Nissenbaum

[57] ABSTRACT

A method for making single crystals of metal or other crystallizing materials whereby powders of irregular shaped single crystal particles (as small as 325 mesh or about 50 microns) may be readily and economically made. Said method comprises the steps of: (a) forming thin individual coatings on each of said particles such as oxides of metals on metal particles; (b) melting the particle material within said coatings which function as individual particle crucibles; (c) cooling the melted particles within the coatings to form individual single crystals each within its own coating; and (d) removing the coating such as by solvation with a solvent or by chemical reaction. The single crystal particles conform to the original shape of the particles which may be irregular. Such irregular shaped single crystals, such as of zinc, when used in electrochemical cell anodes enables the utilization of reduced amounts of mercury for amalgamation thereof without significant increase in cell gassing.

29 Claims, No Drawings

CELL ANODE

This application is a division of application Ser. No. 482,651, filed Apr. 6, 1983, now U.S. Pat. No. 4,487,651.

This invention relates to methods of reducing mercury content in electrochemical cell anode amalgamations and to methods of making single crystal particles, particularly small metal particles. More specifically this invention relates to single crystal zinc particles for use in anodes of electrochemical cells.

Metals such as zinc have been commonly utilized as anodes in electrochemical cells particularly in cells with aqueous alkaline electrolytes. In such cells the zinc is amalgamated with mercury in order to prevent reaction of the zinc with the aqueous electrolyte with the detrimental evolution of hydrogen gas. In the past it has been necessary to utilize about 6–7% by weight of mercury amalgamation in the anode to reduce the amount of "gassing" to acceptable levels. However, because of environmental considerations it has become desirable to eliminate or at the very least reduce the amount of mercury utilized in such cells but without concomitant increase in cell gassing. Various expedients have been utilized, to achieve such mercury reduction, such as special treatment of the zinc, the use of additives and exotic amalgamation methods. However, such methods have either had economic drawbacks or limited success.

It is an object of the present invention to provide a means for permitting the reduction of amounts of mercury used in amalgamation of aqueous electrochemical cell anode metals without significant concomitant increase in cell gassing or reduction of cell performance.

It is a further object of the present invention to provide a novel method for making single crystal particles and wherein the single crystal particles of metals such as zinc and of irregular shape allows for said reduction of mercury.

It is a still further object of the present invention to provide an electrochemical cell having such single crystal metal particles in the anode thereof.

These and other objects, features and advantages of the present invention will become more evident from the following discussion.

Generally the present invention comprises a novel economical method for reducing the amounts of mercury required for amalgamating anode metals without concomitant ill effects. Such method comprises the utilization of irregular shaped single crystal particles in the formation of the cell anode. However, such irregular shape metal particles, such as of zinc, cannot be formed by conventional single crystal forming methods. The formation of single crystals for the most part has been confined to semiconductors and laboratory curiosity and such single crystals have been formed in a variety of ways which have provided relatively large single crystals with generally ordered shapes. Metallic single crystals have generally only been made in the form of very fine "whiskers" which have been difficult and expensive to produce and are utilized, because of their high tensile strength for structural reinforcement. The method described in U.S. Pat. Nos. 3,844,838 and 3,853,625 while forming partial single crystal zinc filaments, also forms polycrystalline side growths. There is thus no presently known method of making irregular shaped single crystal particles particularly of metal and of relatively small particle sizes. Accordingly, the present invention further comprises a novel method for making individual single crystal particles, wherein such particles may be of sizes as small as 325 mesh and of a regular or irregular shape as required. The present invention further encompasses such irregular shaped single crystal particles, the electrochemical cell anodes comprised of such single crystal particles and the electrochemical cells containing such anodes.

It was discovered that a substantial amount of the mercury utilized for amalgamation with metal anode materials, most notably zinc, for reduction of gassing, was entrapped within defects such as grain boundaries, subgrain boundaries and dislocations of the polycrystalline metal particles. Furthermore, such defect areas were also areas of high chemical activity which accelerated detrimental gas formation. However, the use of single crystals made by conventional methods generally comprising controlled melting and freezing, or as in said patents by electrolysis while effective in removing such defects destroyed the utility of the zinc as an anode material or did not provide only single crystals. With the formation of pure single crystals the irregular shape of the metal powder particles required for electrochemical activity i.e. high surface area is eliminated. As a result regular shaped spherical particles in a particle range of −20 to 325 mesh provide about 30% of void space. Similarly sized irregular shaped particles between 50–80% void space. Additionally, in the conventional formation of single crystals the particles themselves are detrimentally fused into lumps or have polycrystalline outgrowths. Electrochemical activity would therefore either be destroyed or substantially curtailed with the use of conventional pure single crystals. Accordingly, such single crystal metals are not effectively utilizable in electrochemical cells.

The present invention comprises a novel method for the formation of small pure single crystal particles particularly of metals such as of zinc wherein the defect areas are eliminated, and the irregular shape of the zinc particles maintained without detrimental lumping of the particles or polycrystalline growths. As a result, reduction of mercury content in anodes of aqueous electrochemical cells was made feasible without loss of electrochemical activity or increase in gassing.

The method of forming single crystals of the present invention generally comprises initially forming a thin continuous coating (e.g. an oxide layer on metal) on each of the particles. Thereafter the particle material is melted within the coating which functions as a "crucible" for containing the molten particle material. The coating also prevents interparticulate fusing or formation of lumps. The molten particle material is then solidified by slow or controlled freezing into single crystal particles having the shape of the coating "crucible" or the original shape of the particle to which such coating was initially conformed. The thin coating layer is then removed and pure single crystal particles are obtained. For use as an anode material, the single crystal particles are irregularly shaped and are mercury amalgamated either after or during such coating removal. The use of these single crystal particle permits reduction of amounts of mercury without significant ill effect. For example, in conjunction with zinc single crystal particles, the amount of mercury utilized for amalgamation may be reduced from 7% to about 4% without significant increase in gassing or detrimental reduction of cell capability.

In order for the method of the present invention to be efficacious it is necessary that the coating composition melts or decomposes at a substantially higher temperature when compared to the particle material whereby it can function as a "crucible" for the molten particle material. Additionally, such coating must be substantially continuous and of sufficient mechanical strength and chemical stability to completely contain the particle material during the melting and freezing stages. Finally the coating should be of sufficiently thin dimension such that it may be readily removed, when required, without disruption of the single crystal particles.

In preferred embodiments, particularly for utilization in electrodes such as anodes of electrochemical cells, the particle materials are metals and the coatings are oxides of the metals respectively. The metals are oxidized, preferably under controlled heating conditions, in the presence of oxidants such as air, $H_2O$, $CO_2$ and the like whereby a thin continuous film of the metal oxide coats each particle. Particles utilized in electrochemical cells are of deliberate irregular configuration for increased surface area and enhanced electrochemical activity. Additionally, the particles in such applications generally range in size from 325 mesh to $-20$ mesh (about 50-500 microns) with an average preferred particle size of between $-100$ to $-200$ mesh. The formation of the oxide coatings is therefore controlled to be substantially uniformly conformed to the irregular particle configuration even with the small particle size and thereafter should maintain such configuration.

After the formation of the oxide coating, the particles are melted within the oxide coatings which function as individual crucibles for the molten metal. Such melting takes place in the absence of oxidants to prevent further growth of the oxide layer. Thus, the oxide coated particles may be melted in a closed container or in an inert atmosphere to avoid such increased oxide growth. As mentioned, in order for the oxide coating to function as a crucible, the oxide of the metal must have a substantially higher melting or decomposition temperature than that of the metal. Examples of metals and their oxides which permit such "crucible" operation and which are utilizable as electrode materials in electrochemical cells (i.e. which provide sufficiently utilizable potentials) include:

TABLE I

| Metal | Melting temp. °C. | Oxide | Melting or decom. temp. °C. |
|---|---|---|---|
| Aluminum | 660 | $Al_2O_3$ | — |
| Cadmium | 320 | CdO | 1500 |
| Calcium | 842 | CaO | 2614 |
| Copper | 1083 | CuO | 1326 |
| Lead | 327 | PbO | 886 |
| Lithium | 180 | $Li_2O$ | 1700 |
| Magnesium | 649 | MgO | 2852 |
| Nickel | 1453 | $NiO_2$ | — |
| Potassium | 64 | $K_2O$ | 350 |
| Rubidium | 39 | $Rb_2O$ | 400 |
| Sodium | 98 | $Na_2O$ | 1275 |
| Tin | 232 | SnO | 1080 |
| Zinc | 419 | ZnO | 1975 |

It is noted that common anode metals such as silver and iron cannot be utilized in providing the single crystal particles of the present invention by utilizing their oxides as the crucible coatings because the melting or decomposition temperatures of the oxides are lower than that of the corresponding metal. With respect to metals such as calcium, nickel and copper while they may be utilized in preparing single crystals in accordance with the present invention, the high melting points of such metals makes such preparation generally economically unfeasible.

The most common anode metal for which the present invention is particularly useful is zinc. The following description and examples therefore describe the formation and utilization of irregular shaped single crystal zinc particles in alkaline electrochemical cells as the anode material thereof.

Zinc melts at a temperature of about 419° C. and zinc oxide has a melting point, far above such temperature, of 1975° C. Additionally, zinc oxide is easily formed into a continuous and very strong coating even when very thin such as of the order of about one micron. The zinc oxide is also easily solvated by materials such as acetic acid for facilitated removal thereof in accordance with normal accepted processes in which the zinc is cleaned prior to use thereof as an anode in an electrochemical cell.

In preparing the irregular shaped single crystal zinc particles, for use as an anode material, irregular shaped polycrystalline zinc particles with a particle size distribution of between $-20$ to 325 mesh with an average particle size of between $-60$ and $-100$ mesh are utilized. Such polycrystalline particles are initially oxidized, preferably in air, at an elevated temperature but below the melting point of the zinc for a selected period of time and temperature whereby a continuous zinc oxide layer is formed on substantially each of the zinc particles. The zinc oxide layer formed should be of sufficient thickness for adequate mechanical strength to contain the subsequently melted and solidfied metal particles therein. Generally, a layer of about one micron has been found to be sufficient for such purpose. For particles in the aforementioned preferred size range a quantitative determination of about 1.5% by weight of zinc oxide generally indicates the formation of an adequate oxide coating. To ensure that the particles are uniformly coated it is preferred that the particles be constantly agitated such as by rotation while being heated.

Once the particles have been substantially oxide coated they are then subjected to a temperature above the melting point of the zinc. Such melting temperature should be sufficient to melt all of the zinc contained within each enclosed particle but preferably not excessively high whereby it becomes unnecessarily uneconomical. An oxidizing temperature range of between 370° C.–400° C. and a melting temperature of at least 470° C. have been found to be sufficient for effecting the oxidation and melting as required. With respect to the melting operation it is carried out in an enclosed container or in an inert atmosphere in order to prevent further oxidation of the zinc.

The melted particles are then furnace cooled which provides a sufficiently slow period of time for the formation of more than about 90% single crystal particles. The single crystal zinc particles are then cleaned by solvation of the zinc oxide coating with acetic acid and then mercury amalgamated (preferably by wet amalgamation to ensure cleaning off of the oxide) for use as conventional anodes in alkaline electrolyte cells. Alternatively the particles may be first amalgamated and then surface cleaned in accordance with accepted zinc anode preparation methods. A 4% mercury amalgamation of the single crystal zinc particles when compared to the same size polycrystalline particles provides comparative gassing results at 90° C. as follows:

TABLE II

| Samples and Treatment | Hg Analysis | ml gas (24 hrs) | ml gas (93 hrs) |
| --- | --- | --- | --- |
| Zinc powders, no treatment | 3.96 | 0.62 | 3.77 |
| Zinc powders, melt/freezed | 4.06 | 0.13 | 1.10 |
| Zinc powders, melt/freezed | 3.98 | 0.15 | 1.58 |

The following examples illustrate the efficacy of the present invention in providing a means whereby reduction of mercury can be effected without increase in cell gassing or significant decrease in cell performance. It is understood that the following examples are presented for illustrative purposes and that details contained therein are not to be construed as limitations on the present invention. Unless otherwise indicated all parts are parts by weight.

EXAMPLE 1

Irregular shaped zinc powder with an average particle size of between −100 to −200 mesh was oxidized in a rotary tube furnace (2⅜" 0.6 cm diameter) at 370° C. with controlled amounts (0.8 CFM) of air as an oxidant. The tube was rotated at 6 rpm with an oxidized zinc production rate of about 4 lbs (8.8 kg)/hr. The oxidized zinc contained about 1.5% ZnO as chemically determined. The oxidized zinc powder was then passed through a belt furnace at the rate of 0.75 in (1.9 cm)/min in closed containers of 2000 gms/container with a furnace temperature of 470° C. The contained zinc was then allowed to slowly cool with nearly 100% production of single crystal zinc particles of substantially the original irregular shapes.

EXAMPLE 2

Seventeen AA size cells were made with $MnO_2$ cathodes (7.4 gms), alkaline electrolytes of 40% KOH (2.625 gms) and anodes of the irregular shaped single crystal zinc particles of Example 1 with 1.75% starch graft copolymer gelling agent and 4% Hg amalgam (2.695 gms—anode weight). The cells were discharged under a 25 ohm load to various cutoff voltages with the discharge times given in Table III.

EXAMPLE 3 (MODIFIED PRIOR ART)

Seventeen cells were made as in Example 2 but with irregular shaped polycrystalline zinc in the anodes. The cells were similarly discharged with the discharge times to various cutoff voltages given in Table III.

EXAMPLE 4 (PRIOR ART)

Sixteen cells were made as in Example 3 but with a 7% mercury amalgam. The cells were similarly discharged with the discharge to various cutoff voltages given in Table III.

TABLE III

| | DISCHARGE DATA (HOURS, 25 LOAD) | | | |
| --- | --- | --- | --- | --- |
| Example No. | 1.1 V | 1.0 V | 0.9 V | 0.8 V |
| 2 | 22.397 | 26.009 | 29.135 | 32.936 |
| | (.342)* | (.333) | (.442) | (.618) |
| 3 | 22.691 | 26.526 | 29.809 | 34.202 |
| | (.253) | (.215) | (.251) | (.424) |
| 4 | 22.693 | 26.474 | 26.642 | 33.849 |
| | (.400) | (.355) | (.436) | (.571) |

*Indicates deviation error

It may be noted from the above comparative table that the capacity of the cells having the single crystal zinc particles in the anodes thereof is not significantly different from those of the cells utilizing the polycrystalline zinc in the anodes.

EXAMPLE 5

Cells were made as in Examples 2, 3, and 4 and were tested for gas evolution after periods of storage at 71° C. of 0, 1 week, 2 weeks and 4 weeks, after no discharge, 25% of discharge (25% of the time required for discharge to 0.8 volts) and after 100% of discharge with the results given in Table IV.

TABLE IV

| Time at 71° C. | | Example 2 cells No Dischar. | 25% | 4% amal. 100% | Example 3 cells No Dischar. | 25% | 4% amal. 100% | Example 4 cells No Dischar. | 25% | 7% amal. 100% |
| --- | --- | --- | --- | --- | --- | --- | --- | --- | --- | --- |
| 0 | Volume gas (ml) | 0.23 | 0.33 | 0.43 | 0.20 | 0.34 | 0.44 | 0.14 | 0.25 | 0.40 |
| | No. of cells | 3 | 4 | 4 | 4 | 4 | 4 | 4 | 4 | 3 |
| 1 Week | Volume gas (ml) | 0.43 | 0.54 | 0.86 | 0.73 | 0.97 | 1.19 | 0.37 | 0.59 | 0.80 |
| | No. of cells | 4 | 4 | 4 | 4 | 4 | 4 | 4 | 4 | 4 |
| 2 Weeks | Volume gas (ml) | 0.69 | 0.78 | 1.11 | 0.81 | 1.37 | 1.60 | 0.35 | 0.73 | 1.20 |
| | No. of cells | 4 | 4 | 4 | 4 | 4 | 4 | 4 | 4 | 4 |
| 4 Weeks | Volume gas (ml) | 1.18 | 1.35 | 2.98 | 1.74 | 3.61 | 3.78 | 0.59 | 1.33 | 2.82 |
| | No. of cells | 4 | 5 | 4 | 4 | 2 | 5 | 4 | 5 | 4 |

It is evident from the above comparative tables that the utilization of the single crystal zinc particles of the present invention permits reduction of the amounts of mercury required for amalgamation from 7% to about 4% with nearly equivalent discharge and gassing characteristics. In fact, the direct comparisons between the cells having the single crystal zinc anodes and the polycrystalline anodes with the same 4% of mercury amalgamation clearly delineate the advantages of the present invention.

It is understood that the above examples are illustrative of the present invention and are not to be construed as being limitations of the present invention. Changes in the composition of the crystallized materials, the coatings, processes as well as the structure and components of the cells may be made without departing from the scope of the present invention as defined in the following claims.

What is claimed is:

1. An anode for an electrochemical cell comprising an anode active material consisting essentially of irregularly shaped single crystal metal particles.

2. The anode of claim 1 wherein said metal is zinc.

3. The anode of claim 2 wherein said single crystal zinc particles are amalgamated with mercury.

4. The anode of claim 1 wherein said anode further comprises a gelling agent.

5. An anode for an electrochemical cell comprised of single crystal metal particles having a particle size up to about −20 mesh.

6. The anode of claim 5 wherein said metal is zinc.

7. The anode of claim 6 wherein the average particle size of said single crystal zinc particles is between about −100 and +200 mesh.

8. The anode of claim 6 wherein the average particle size is between −60 and +100 mesh.

9. The anode of claim 6 wherein said singles crystal zinc particles are amalgamated with mercury.

10. The anode of claim 5 wherein said anode further comprises a gelling agent.

11. The anode of claim 9 wherein said mercury comprises up to about 4% by weight of said anode.

12. An anode for an electrochemical cell comprised of single crystal metal particles, said particles having been made by the steps comprising:
   (a) forming individual substantially continuous coatings on the external surfaces of each of the individual particles of a particulate metal material which is capable of being crystallized, said coatings being of a material having higher melting and decomposition temperatures than the melting temperature of said particulate metal material and wherein said coatings are each of a thickness and composition with sufficient mechanical strength to act as self-supporting shape retaining crucibles for said metal particles when such metal particles are melted;
   (b) raising the temperature of said coated particulate metal material to above the melting point thereof but below the lower of the melting point or the decomposition temperature of said coating material whereby substantially all of the particulate metal material is melted within said coating; and
   (c) slowly cooling said particulate metal material whereby substantially all of said particles become individual single metal crystals.

13. The anode of claim 12 wherein said metal is zinc.

14. The anode of claim 13 wherein said single crystal zinc particles are amalgamated with mercury.

15. The anode of claim 12 wherein said anode further comprises a gelling agent.

16. The anode of claim 12 wherein said single crystal metal particles have a particle size up to −20 mesh.

17. The anode of claim 16 wherein said metal is zinc.

18. The anode of claim 17 wherein the average particle size of said single crystal zinc particles is between about −100 and +200 mesh.

19. The anode of claim 17 wherein the average particle size is between −60 and +100 mesh.

20. The anode of claim 17 wherein said single crystal zinc particles are amalgamated with mercury.

21. The anode of claim 20 wherein said anode further comprises a gelling agent.

22. The anode of claim 21 wherein said mercury comprises up to about 4% by weight of said anode.

23. An electrochemical cell having the anode of any of claims 1-22.

24. An electrochemical cell comprising a manganese dioxide cathode, an alkaline electrolyte and an anode consisting essentially of mercury amalgamated single crystal zinc particles.

25. The cell of claim 24 wherein said anode further contains a gelling agent.

26. An electrochemical cell comprising a manganese dioxide cathode, an alkaline electrolyte and an anode comprising mercury amalgamated single crystal zinc particles, wherein said single crystal zinc particles have a particle size of −20 mesh.

27. The cell of claim 26 wherein said anode further contains a gelling agent.

28. A method for retarding gassing in an aqueous electrochemical cell having a mercury amalgamated zinc anode wherein said mercury comprises up to about 4% by weight of said anode, said method comprising the step of forming said anode with zinc particles consisting essentially of irregularly shaped single crystals.

29. The method of claim 28 wherein said mercury amalgamated zinc anode is gelled with a gelling agent.

* * * * *